(12) United States Patent
Martin et al.

(10) Patent No.: US 6,229,333 B1
(45) Date of Patent: May 8, 2001

(54) APPARATUS FOR REDUCING INDUCED SWITCHING TRANSIENTS

(75) Inventors: Chris G. Martin; Stephen L. Casper, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/580,662

(22) Filed: May 26, 2000

Related U.S. Application Data

(62) Division of application No. 09/145,065, filed on Sep. 1, 1998.

(51) Int. Cl.[7] .................................................... H03K 17/16

(52) U.S. Cl. ................... 326/27; 326/30; 326/83; 365/180.05

(58) Field of Search ................................. 326/22, 21, 26, 326/27, 30, 83, 86; 365/189.05, 180.06, 189.11

(56) References Cited

U.S. PATENT DOCUMENTS 5,060,196 * 10/1991 Pae et al. ......................... 365/189.05
5,345,421 * 9/1994 Iwamura et al. ................. 365/189.05
6,127,839 10/2000 Martin et al. ........................... 326/27

* cited by examiner

Primary Examiner—Michael Tokar
Assistant Examiner—Don Phu Le
(74) Attorney, Agent, or Firm—Dorsey & Whitney LLP

(57) ABSTRACT

An attenuating circuit for reducing the inductively induced voltage transients in an electrical signal. The attenuating circuit is formed by a primary circuit and a smoothing circuit both coupled to a voltage source through an inductive conductor. The primary circuit operates in two states having a first and second current draw, respectively. The smoothing circuit also has a first and second state and a first and second current draw, respectively. The current draws of the primary circuit and the smoothing circuit are such that the total current draw on the voltage source through the inductive conductor maintains relatively constant regardless of the state that the primary circuit is in, thus minimizing any induced voltage transients as a result of the conductor's inductance.

24 Claims, 5 Drawing Sheets

APPARATUS FOR REDUCING INDUCED SWITCHING TRANSIENTS

CROSS-REFERENCE TO RELATED APPLICATION

This application is a divisional of pending U.S. patent application Ser. No. 09/145,065, filed Sep. 1, 1998.

TECHNICAL FIELD

This invention relates to circuit devices, and more particularly, to a method and apparatus for reducing inductive switching transients in an electrical signal.

BACKGROUND OF THE INVENTION

Conventional electrical circuits inherently contain inductance. Inductance resists changes in current flow and can introduce transient voltage spikes when the current flow suddenly changes. These voltage spikes can be an order of magnitude or more greater than the voltage of the signal itself. The greater the inductance in a circuit, the more resistive it will be to changes in current flow, thereby inducing larger transient voltage spikes.

Induced transient voltages can be particularly problematic in power and ground wiring. Power and ground voltages typically are transmitted to numerous electrical components in a circuit, often through a few, relatively long wires. Generally, increasing the length of a particular wire will cause an increase in the inductance of the wire. Relatively long power and ground wires can therefore have a relatively large inductance. Sudden changes in the current consumed by a circuit that is powered by these relatively long power and ground wires can produce large voltage spikes in the wires. Because the power and ground wires are often coupled to many circuits, the induced voltage spikes can also be coupled to these many circuits.

An example of a circuit in which voltage transients are inductively generated in lines applying power to the circuit is illustrated in FIG. 1. An inverter circuit 2 is formed by a PMOS transistor 4 and an NMOS transistor 6. A source of the PMOS transistor 4 is coupled to a supply voltage $V_1$ through a conductor 8, and a source of the NMOS transistor 6 is coupled to ground through a conductor 9. The drains of the transistors 4, 6 are coupled to each other and to one terminal of a load L. Another terminal of the load L is coupled to a voltage $V_T$. For this example, the conductors 8, 9 are assumed to be bonding wires extending from an integrated circuit chip (not shown) to external terminals (not shown) of the integrated circuit. The ends of the conductors 8, 9 that are coupled to the circuit 2 are also coupled to other circuits (not shown) on the integrated circuit chip. As result, any voltage transients that are inductively generated by the conductors 8, 9 our coupled to these other circuits.

In operation, when the input signal IN is a logic "1" equal to the supply voltage $V_1$, the NMOS transistors 6 is turned ON and the PMOS transistor 4 is turned OFF so that current flows to ground through the NMOS transistor 6 and the conductor 9. When the input signal IN is logic "0" equal to ground potential, the PMOS transistor 4 is turned ON and the NMOS transistor 6 is turned OFF so that current flows from the supply voltage $V_1$ through the conductor 8 and the PMOS transistor 4.

As is known in the art, the conductors 8, 9 have a small but nevertheless significant inductance. As a result, voltages transients are generated at the sources of the transistors 4, 6, as illustrated by the waveforms $V_{X1}$ and $V_{X2}$ shown in FIG. 2. As shown in FIG. 2, prior to time $t_0$, the voltage $V_{X1}$ is at $V_1$ because the PMOS transistor 4 is ON. At time $t_0$, the input signal IN transitions high, thereby turning OFF the PMOS transistor 4 and turning ON the NMOS transistor 6. Turning OFF the PMOS transistor 4 abruptly terminates the flow of current through the conductor 8, thereby causing a positive voltage transient or spike to be generated at time $t_0$. The voltage transient is, of course, coupled to the other circuits on the integrated circuit chip that are powered through the conductors 8, 9. The voltage transient is of a sufficient magnitude that it may very well cause these other circuits to erroneously respond to the voltage transient.

As further shown in FIG. 2, at time $t_1$ the input signal IN goes low, thereby turning ON the PMOS transistor 4 and turning OFF the NMOS transistor 6. Turning OFF the NMOS transistor 6 abruptly terminates the flow of current through the conductor 9, thereby causing a negative voltage transient to be generated. Again, this voltage transient is coupled to the other circuits on the integrated circuit chip that are powered through the conductors 8, 9. The inductance of power lines can therefore great significant problems in high-speed digital integrated circuits.

Induced voltage transients are particularly troublesome when they are coupled to high speed circuits because high speed circuits are particularly sensitive to voltage transients.

Problems caused by induced voltage transients tend to increase with a decrease in the magnitude of supply voltages. Typically, digital circuits powered by reduced supply voltages use correspondingly reduced switching levels. As a result, these digital circuits are more susceptible to voltages transients.

One technique for making a digital circuit less susceptible to voltage transients is to raise the switching levels of switching devices used in the circuit. However, raising the switching levels in a digital circuit can create other problems. For example, raising switching levels can decrease the operating speed of a digital circuit because it requires more time for signals transitioning between logic levels to transition over a larger voltage range.

In the past, filter capacitors coupled to power and ground lines have been used to attenuate voltage transients on these lines. Although filter capacitors continue to be useful in attenuating voltage transients on power and ground lines, they may not be capable of adequately attenuating relatively large voltage transients. Furthermore, since capacitors that are large enough to filter voltage transients cannot easily and inexpensively be fabricated on integrated circuits, filter capacitors are of limited usefulness for attenuating voltage transients generated in integrated circuits.

As mentioned above, the inductance of a power line is generally proportional to its length. Reducing the lengths of power lines can therefore reduce their inductance, and thereby correspondingly decrease the magnitude of voltage transients induced in the lines. One approach to reducing the length of power lines is to use a packaging arrangement known as a "Ball Grid Array" ("BGA"). A BGA is a grid of contacts laid out over a surface of an integrated circuit package that is placed against a surface of a printed circuit board or other substrate. The BGA contacts are coupled to similar contacts formed on the surface of the substrate, thus resulting in a relatively short signal path between the integrated circuit package and the substrate. In contrast, pins and the like formed along the edges of integrated circuit packages constitute a substantially longer short signal path between the integrated circuit package and the substrate. Furthermore, since the external contacts of a BGA are positioned beneath the integrated circuit chip, the lengths of internal lead wires extending from the chip to the external contacts are relatively short. In contrast, lead wires extending from a chip to external contact pins positioned along the periphery of an integrated circuit package are substantially longer. The use of BGAs has several drawbacks. BGAs are more difficult to mount, requiring a more elaborate layout so power leads can route through the appropriate layers and around other traces and components. This more elaborate layout also contributes to increased fabrication costs and time. Also, BGAs may not be capable of adequately reducing inductance in power and signal lines, and they are not effective in reducing the inductance of power and signal lines formed on the integrated circuit chip.

Yet another approach to reducing the inductance of power and signal lines, particularly bond wires extending between integrated circuit chips and external contacts, is to use low inductance alloys for the bond wires. The inductance of a wire decreases with the magnetic permeability of the material in the wire. Therefore a wire using an alloy having a decreased magnetic permeability will have a lower inductance than the equivalent wire made of conventional bond wire. The drawback to using low permeability alloys is that they are typically more expensive and less reliable overall than conventional bond wire.

There is therefore a need to effectively reduce the sensitivity of circuits to induced voltage transients in power and signal lines.

SUMMARY OF THE INVENTION

The present invention provides apparatus and methods for reducing switching transients induced in power or signal lines that are connected to a primary circuit. A smoothing circuit is connected to the power or signal lines in parallel with the primary circuit. The primary circuit performs a predetermined function in response to receiving at least one input signal, and, in performing that function, the current drawn by the primary circuit through the power or signal line changes. The smoothing circuit responds to the same input signal or signals by changing the current drawn by the smoothing circuit through the power or signal line in a manner that is opposite the change in current drawn by the primary circuit. As a result, the current flow through the power or signal remains substantially constant despite substantial changes in the current drawn through the power or signal line by the primary circuit responsive to the input signal or signals.

DETAILED DESCRIPTION OF THE INVENTION

Figure 3:
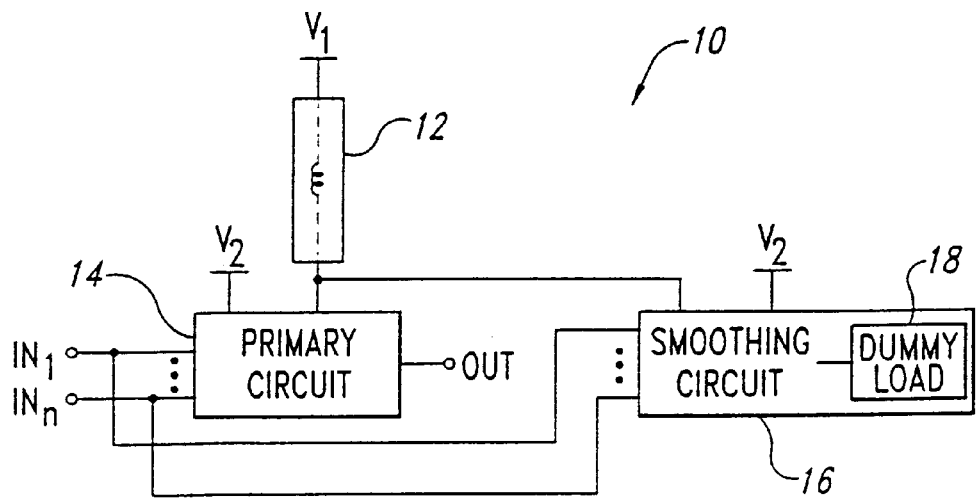
FIG. 3 is a functional block diagram of an attenuating circuit in accordance with one embodiment of the present invention.

FIG. 3 is a functional block diagram of an embodiment of an attenuating circuit 10 in accordance with the invention. The attenuating circuit 10 is adapted to attenuate voltage transients induced in a first inductive conductor 12 responsive to sudden changes in the current flowing through the conductor 12. The conductor 12 is coupled at one end to a first power supply voltage $V_1$ and at the other end to the power input of a primary circuit 14. The primary circuit 14 includes a signal input that receives an input signal $IN_1$. The primary circuit is also coupled to a second power supply voltage $V_2$, which may be ground potential. In operation, the current drawn by the primary circuit 14 through the conductor 12 changes responsive to changes in the input signal $IN_1$. The primary circuit 14 may be a digital circuit, such as a memory output buffer, or it may be an analog circuit.

As shown in FIG. 3, the attenuating circuit 10 includes a smoothing circuit 16. The smoothing circuit includes power inputs that are also coupled to the first and second power supply voltages $V_1$ and $V_2$, respectively, and a signal input that also receives the input signal $IN_1$. Thus, the primary circuit 14 and the smoothing circuit 16 are coupled to the same supply voltages $V_1$ and $V_2$, and they receive the same input signal $IN_1$. Like the primary circuit 14, the current drawn by the smoothing circuit 16 through the conductor 12 changes responsive to changes in the input signal $IN_1$. The current drawn by the smoothing circuit 16 changes responsive to the input signal $IN_1$ by the same magnitude but in the opposite direction as the changes in the current drawn by the primary circuit 14 responsive to the input signal. For example, if the current drawn through the conductor 12 by the primary circuit 14 increases from 1 ampere to 2 amperes responsive to a change in the input signal $IN_1$ from a logic "0" to a logic "1", the current drawn through the conductor 12 by the smoothing circuit 14 will decreases from 2 amperes to 1 ampere. As a result of the smoothing circuit 16 compensating for changes in the current drawn by the primary circuit 14, the current through the conductor 12 remains substantially constant as the input signal $IN_1$ switches between logic levels. The constant current in the conductor 12 prevents voltage transients from being induced in the conductor 12 regardless of the inductance of the conductor 12 or the magnitude or rate of change in the current drawn by the primary circuit 14.

The smoothing circuit 16 preferably drives a "dummy load" 18. The dummy load is so named because it preferably has the same impedance as a load (not shown) that is coupled to an output terminal OUT of the primary circuit 14, and it is provided solely to serve as a load for the smoothing circuit 16. The smoothing circuit 16 can therefore be the same or substantially the same circuitry as the primary circuit 14 coupled to receive the input signal $IN_1$ in a complimentary manner or it may simply operate in a complimentary manner. For example, where the primary circuit 14 is a differential amplifier having its non-inverting input receiving the input signal $IN_1$, the smoothing circuit 16 can be implemented using the same differential amplifier with the input signal $IN_1$ applied to its inverting input rather than the non-inverting input. Alternatively, the smoothing circuit 16 can be implemented using a differential amplifier having its non-inverting input receiving the input signal $IN_1$, but it may be constructed to operate in a complimentary manner.

It is preferable for the smoothing circuit 16 and the primary circuit 14 to be coupled to the conductor 12 at the same location, as shown in FIG. 3, because this topology generally provides the optimum compensation for changes in current drawn by the primary circuit 14. However, adequate compensation for changes in current drawn by the primary circuit 14 may also be achieved in certain cases by coupling the smoothing circuit 16 and the primary circuit are 14 to the conductor 12 at different locations. The smoothing circuit 16 should be coupled to the conductor as close as reasonably possible to the location that the primary circuit 14 is coupled to the conductor 12.

In another embodiment, also shown in FIG. 3, the primary circuit 14 and the smoothing circuit 16 each have multiple signal inputs that receive respective input signals $IN_1 \ldots IN_n$. In operation, the current drawn by the primary circuit 14 and the smoothing circuit 16 through the conductor 12 changes responsive to changes in the input signals $IN_1 \ldots IN_n$. The remainder of the attenuating circuit 10 functions similarly to what is described above, and further discussion is omitted in the interest of brevity.

Figure 4:
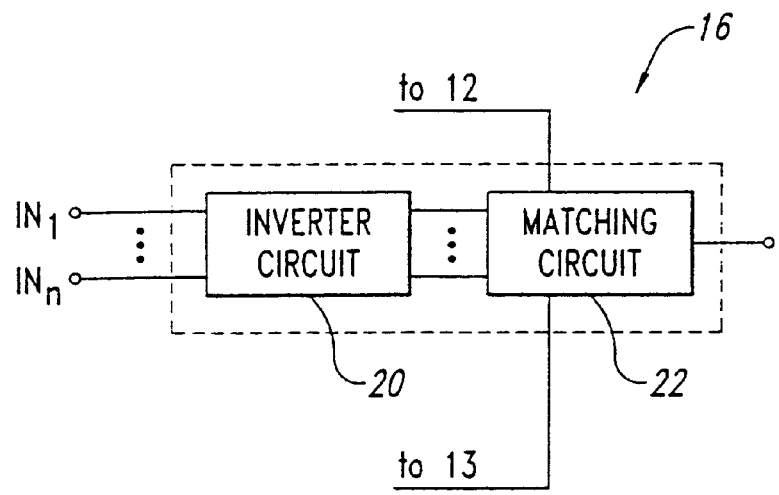
FIG. 4 is a functional block diagram of a smoothing circuit in accordance with another embodiment of the present invention.

FIG. 4 is a functional block diagram of another embodiment of the smoothing circuit 16 shown in FIG. 3. The smoothing circuit 16 includes an inverter circuit 20 and a matching circuit 22. The inverter circuit 20 receives the input signal $IN_1$, and applies its compliment to an input terminal of the matching circuit 22. The matching circuit 22 has substantially the same current drawing characteristics as the primary circuit 14 responsive to the input signal $IN_1$. In fact, the matching circuit 22 may be the same circuit as the primary circuit 14. However, since the matching circuit 22 receives the compliment of the input signal $IN_1$ received by primary circuit 14, its current draw will compliment the current draw of the primary circuit 14. The current through the conductor 12 therefore remains substantially constant as the input signal $IN_1$ switches between logic levels.

In another embodiment, also shown in FIG. 4, the inverter circuit 20 receives multiple input signals, $IN_1 \ldots IN_n$, and applies their compliments to respective input terminals of the matching circuit 22. The matching circuit 22 operates in substantially the same manner as described above with reference to FIG. 4 to maintain the current through the conductor 12 substantially constant as the input signals $IN_1 \ldots IN_n$ switch between logic levels.

Figure 5:
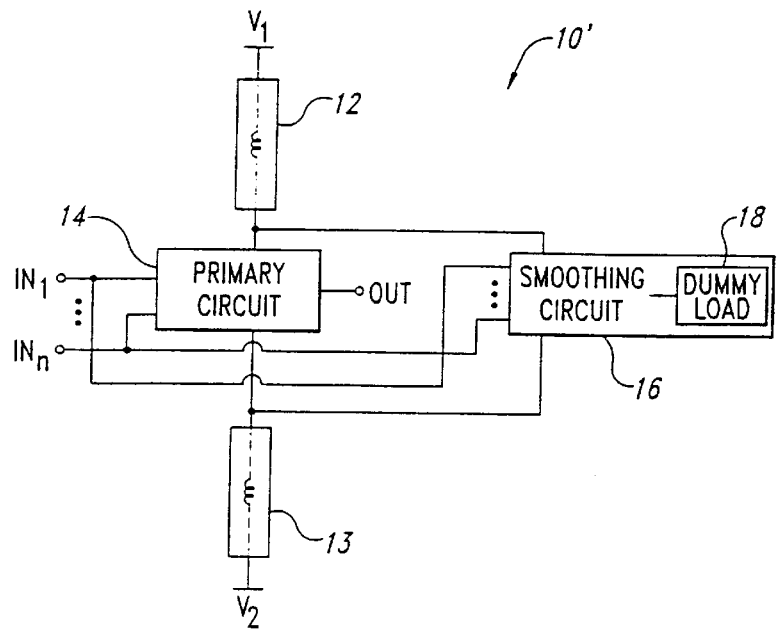
FIG. 5 is a functional block diagram of an attenuating circuit in accordance with another embodiment of the present invention.

FIG. 5 is a functional block diagram showing another embodiment of an attenuating circuit 10' in accordance with the invention. The attenuating circuit 10' is adapted to attenuate voltage transients induced in first and second inductive conductors 12, 13, respectively. The conductors 12, 13 couple respective first and second power supply voltages $V_1$ and $V_2$ to respective first and second power inputs of the primary circuit 14. The attenuating circuit 10' includes the smoothing circuit 16 coupled to the first and second inductive conductors 12, 13, respectively, in the same manner as the primary circuit 14. The smoothing circuit 16 operates with the primary circuit 14 in substantially the same manner as described above with reference to FIG. 3 to maintain the current through the conductors 12, 13 substantially constant as the input signal $IN_1$ switches between logic levels.

In another embodiment, also shown in FIG. 5, the primary circuit 14 and the smoothing circuit 16 receive multiple input signals $IN_1 \ldots IN_n$. The smoothing circuit 16 operates with the primary circuit 14 in substantially the same manner as described above with reference to FIG. 3 to maintain the current through the conductors 12, 13 substantially constant as the input signals $IN_1 \ldots IN_n$ switch between logic levels.

Figure 6:
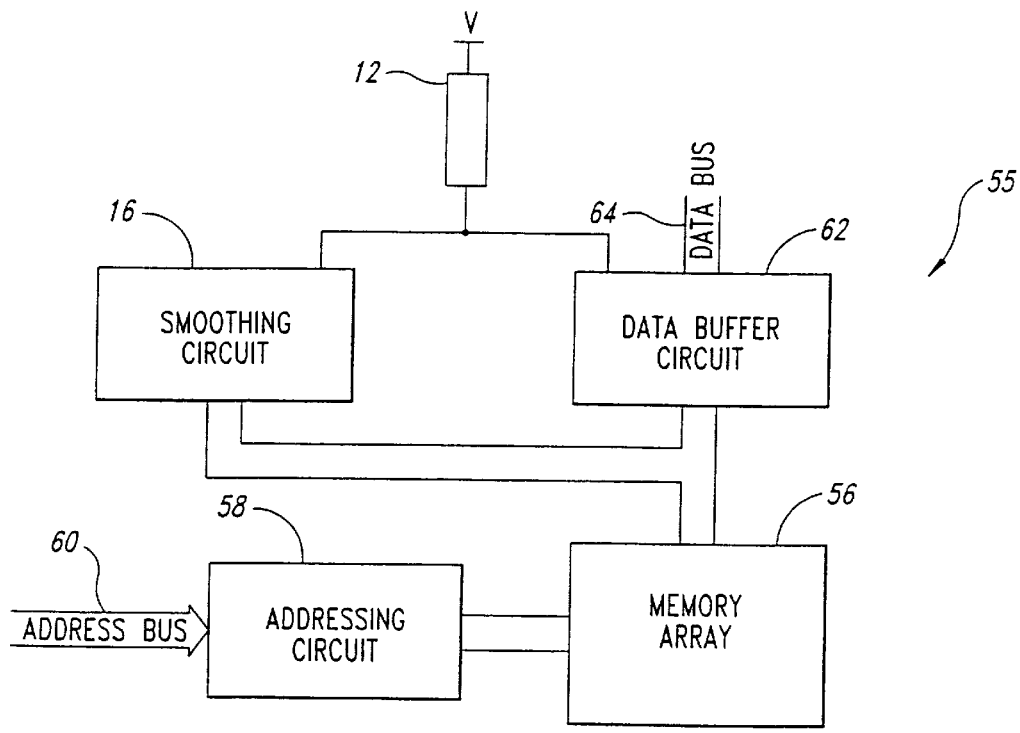
FIG. 6 is a functional block diagram showing the attenuating circuit of FIGS. 3–5 used in a conventional memory device.

The attenuating circuits 10, 10' of FIGS. 3 and 5, respectively, can be used in an integrated memory device 55, which is illustrated in general form in FIG. 6. The integrated memory device 55 includes a memory array 56 containing a large number of memory cells, each of which stores one bit of data. A particular cell or group of cells in the array is selected by an addressing circuit 58 (which may include buffers and decoders) as a function of an address received on an address bus 60. Data read from or written to the memory array 56 is routed through a data buffer circuit 62 to or from a data bus 64. The smoothing circuit 16 can be coupled to any circuit in the memory device 55 in which it is desired that inductive effects be minimized, such as, for example, the data buffer circuit, as shown in FIG. 6. The circuit that the smoothing circuit 16 is coupled to will then maintain an approximately constant current draw from its voltage source through its inductive conductor 12 as described above, and any induced voltage transients will be minimized.

Figure 1:
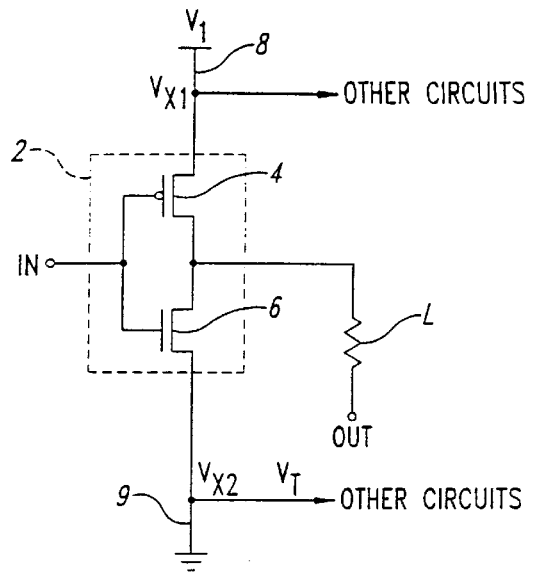
FIG. 1 is a schematic diagram of a conventional circuit illustrating an example of voltage transients being inductively generated on conductors applying power to the circuit.
Figure 2:
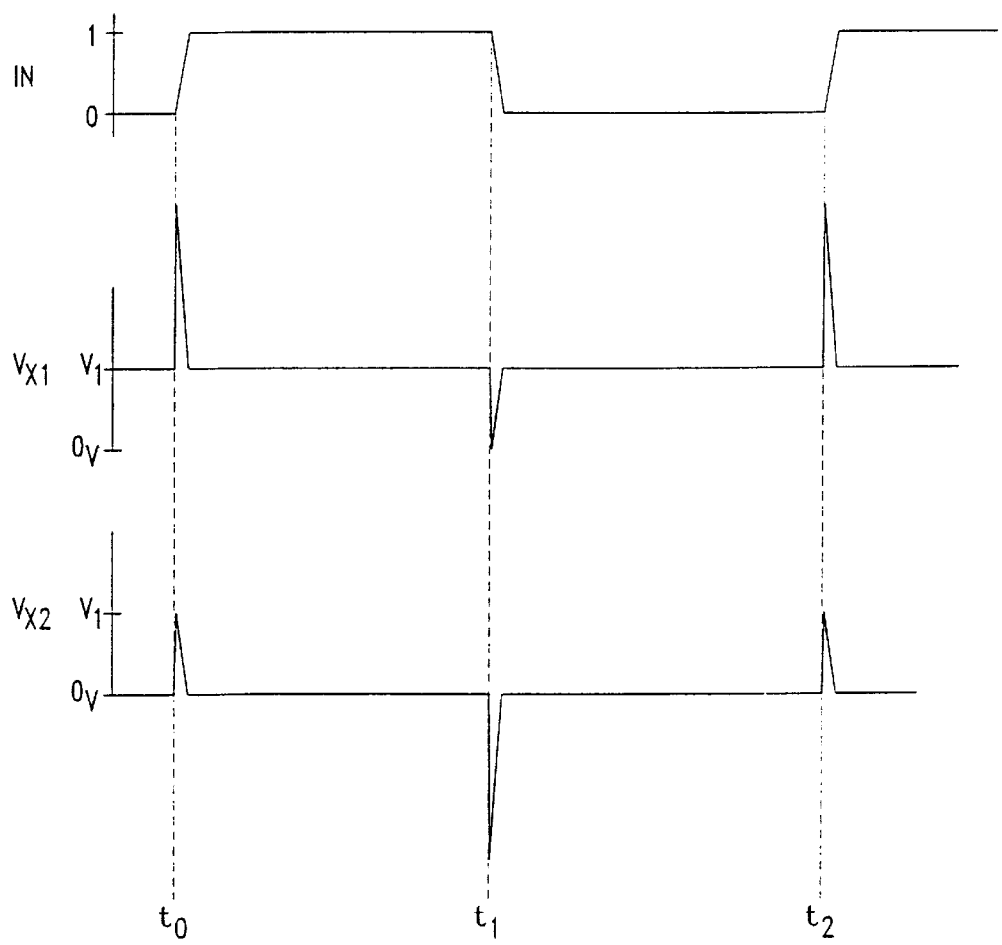
FIG. 2 is a waveform diagram showing various signals present in the circuit of FIG. 1.
Figure 7:
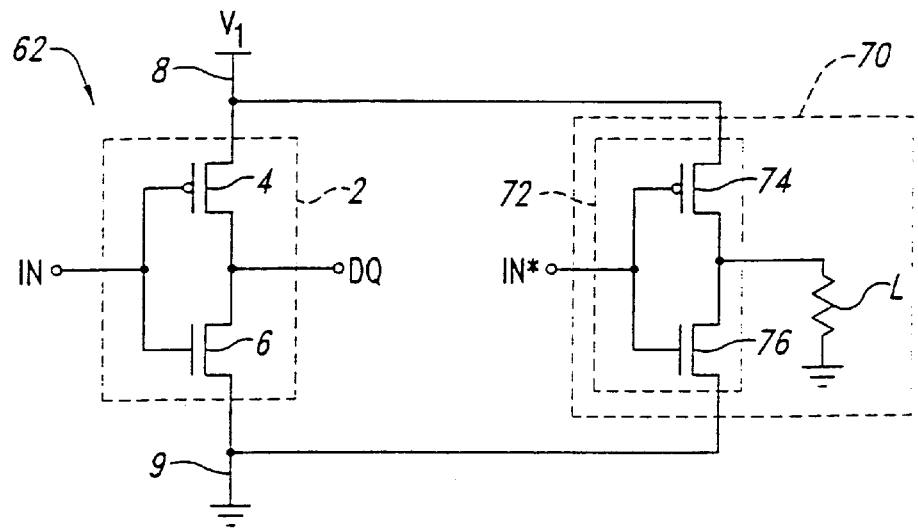
FIG. 7 is a partial schematic diagram of an output data buffer used in the memory device shown in FIG. 6.

One embodiment of a smoothing circuit 70 that can be used as the smoothing circuit 16 with the data buffer circuit 62 shown in FIG. 6 is illustrated in FIG. 7. The data buffer circuit 62 is assumed to use the inverter circuit 2 explained above with reference to FIG. 1 as its data output buffer. The inverter circuit 2 receives data from the memory array 56 and outputs data to a data bus terminal DQ.

The smoothing circuit 70 uses an inverter circuit 72, including a PMOS transistor 74 and an NMOS transistor 76. The transistors 74, 76 are substantially identical to the PMOS transistor 4 and the NMOS transistor 6 in the inverter circuit 2. The inverter circuit 72 drives a load L having substantially the same impedance as circuitry that would be connected to the data bus terminal DQ. The inverter circuit 72 receives the complement of the input signal IN* and thus operates in a manner that is complementary to the inverter circuit 2, which receives the input signal IN. The smoothing circuit 70 therefore compensates for any changes in the current drawn through the power leads 8, 9 by the data buffer circuit 62.

Figure 8:
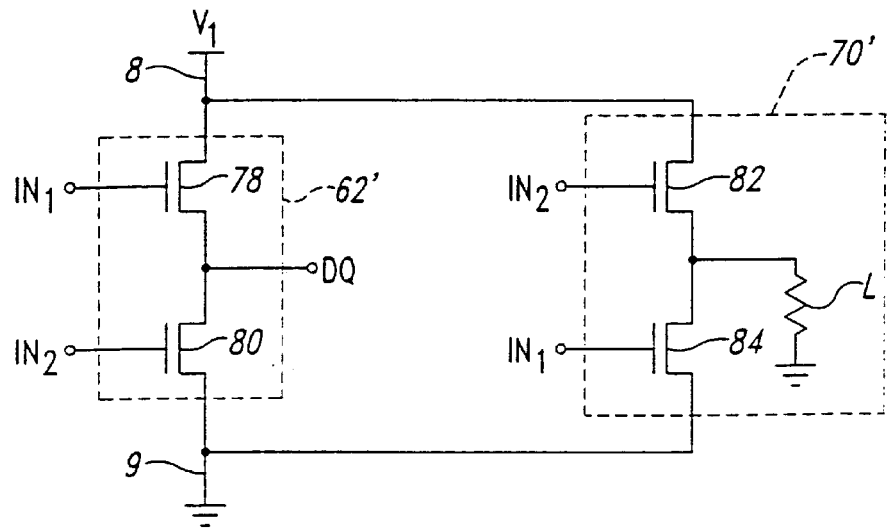
FIG. 8 is a partial schematic diagram of another embodiment of an output data buffer used in the memory device shown in FIG. 6.
Figure 9:
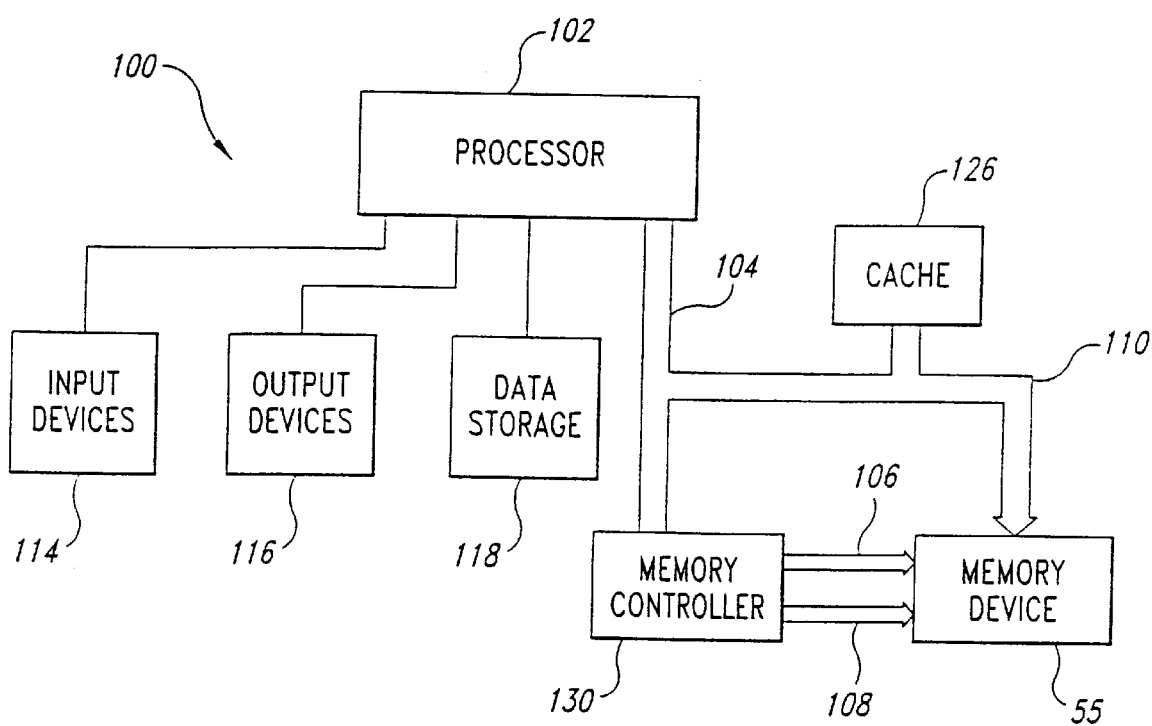
FIG. 9 is a functional block diagram showing a computer system using the memory device of FIG. 6.

Another embodiment of a smoothing circuit 70' that can be used as the smoothing circuit 16 with a data buffer circuit 62' is illustrated in FIG. 8. The data buffer circuit 62' can be used in place of the data buffer circuit 62 in FIG. 6. With reference to FIG. 8, the data buffer circuit 62' is formed by a pair of NMOS transistors of 78, 80. A drain of the NMOS transistor 78 is coupled to a supply voltage $V_1$ through a conductor 8, and a source of the NMOS transistor 80 is coupled to ground through a conductor 9. A source of the transistor 78 is coupled to a drain of the transistor 80, and to a data bus terminal DQ. The gates of the NMOS transistors 78, 80 receive input signals $IN_1$, $IN_2$ from the memory array 56. Typically the input signals $IN_1$, $IN_2$ will be the complement of each other.

The smoothing circuit 70' uses two NMOS transistors 82, 84 that are substantially identical to the NMOS transistors 78, 80. A drain of the NMOS transistor 82 is coupled to the supply voltage $V_1$ through the conductor 8, and a source of the NMOS transistor 84 is coupled to ground through the conductor 9. A source of the transistor 82 is coupled to a drain of the transistor 84 and to a load L. A gate of the NMOS transistor 82 receives the input signal $IN_2$ and a gate of the NMOS transistor 84 receives the input signal $IN_1$. The NMOS transistors 82, 84 drive the load L which has substantially the same impedance as circuitry that would be connected to the data bus terminal DQ.

In operation, when the input signal $IN_1$ is a logic "0" and the input signal $IN_2$ is a logic "1", the NMOS transistor 78 is turned OFF and the NMOS transistor 80 is turned ON so that no current flows from the supply voltage $V_1$ through the conductor 8 and the NMOS transistor 78 to the data terminal DQ. In contrast, the NMOS transistor 82 is turned ON so that current flows from the supply voltage $V_1$ through the conductor 8 and the NMOS transistor 82 to the load L.

Similarly, when the input signal $IN_1$ is a logic "1" and the input signal $IN_2$ is a logic "0", the NMOS transistor 78 is turned ON and the NMOS transistor 82 is turned OFF so that current flows from the supply voltage $V_1$ to the data terminal DQ. In contrast, the NMOS transistor 82 is turned OFF so that no current flows from the supply voltage $V_1$ to the load L.

The NMOS transistors 80, 84 operate in a substantially similar way to what is described above with respect to current flowing to ground through the conductor 9. Therefore, further discussion is omitted in the interest of brevity.

Thus, the smoothing circuit 70' and the data buffer circuit 62' operate in complementary fashion with respect to current draw through the conductors 8, 9. The smoothing circuit 70' therefore compensates for any changes in the current drawn through the power leads 8, 9 by the data buffer circuit 62'.

FIG. 8 is a block diagram of a computer system 100 which includes the memory device 55 of FIG. 5, including the portion of the data output buffer 70, 70' shown in FIGS. 7 and 8 respectively. The computer system 100 includes a processor 102 for performing various computing functions, such as executing specific software to perform specific calculations or tasks. The processor 102 includes a processor bus 104 that normally includes an address bus, a control bus, and a data bus. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to the memory device 55 through a memory controller 130. The memory controller 130 normally includes the control bus and the address bus that is coupled to the memory device 55. The data bus may be coupled to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A dynamic random access memory having an address bus and at least one data bit line, comprising:

an array of memory cells having a plurality of memory cells arranged in rows and columns, a plurality of row lines, and at least one digitline for each column of memory cells;

an addressing circuit coupled to the address bus, the addressing circuit adapted to receive row and column addresses on the address bus and activate a corresponding memory cell in the array;

an output data buffer circuit coupled between the array and the data bit line, the output data buffer circuit adapted to receive a data bit and to transmit the data bit to the data bit line; and a smoothing circuit having a load circuit, the smoothing circuit having current draw characteristics that are complementary to a memory circuit in the dynamic random access memory, the memory circuit being coupled to a first voltage source through a first conductor having an inductance, the smoothing circuit being coupled to the first voltage source through the first conductor.

2. The dynamic random access memory of claim 1, wherein the smoothing circuit comprises a circuit having complementary current draw characteristics to the output data buffer circuit.

3. The dynamic random access memory of claim 2 wherein the output data buffer circuit comprises a pair of serially coupled NMOS transistors between the first voltage source and a second voltage source, the first transistor coupled to the first voltage source through the first conductor, the transistors coupled together at a first node, the first node coupled to the data bit line.

4. The dynamic random access memory of claim 3 wherein the smoothing circuit comprises a third and fourth serially coupled NMOS transistors between the first voltage source and a second voltage source, the third transistor coupled to the first voltage source through the first conductor, the third and fourth transistors coupled together at a second node, the second node coupled to a dummy load.

5. The dynamic random access memory of claim 1 wherein the smoothing circuit comprises a circuit that is a functionally identical copy of the primary circuit.

6. The dynamic random access memory of claim 1 wherein the circuit is coupled to the first conductor at a first location, and the smoothing circuit is coupled to the first conductor at the first location.

7. The dynamic random access memory of claim 1 wherein the circuit is coupled to the first conductor at a first location, and the smoothing circuit is coupled to the first conductor at a second location, the second location being relatively close to the first location.

8. The dynamic random access memory of claim 1 wherein the circuit is coupled to a second voltage source through a second conductor having an inductance, the circuit coupled to the second conductor at a third location.

9. The dynamic random access memory of claim 8 wherein the smoothing circuit is coupled to the second conductor at the third location.

10. The dynamic random access memory of claim 8 wherein the smoothing circuit is coupled to the second conductor at the fourth location, the fourth location being relatively close to the third location.

11. The dynamic random access memory of claim 1 wherein the first voltage source is Vcc.

12. The dynamic random access memory of claim 8 wherein the second voltage source is ground.

13. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device coupled to the processor through the processor bus and having an address bus and a data bit line, the memory device comprising:

an array of memory cells having a plurality of memory cells arranged in rows and columns, a plurality of row lines, and at least one digitline for each column of memory cells;

an addressing circuit coupled to the address bus, the addressing circuit adapted to receive row and column addresses on the address bus and activate a corresponding memory cell in the array;

an output data buffer circuit coupled between the array and the data bit line, the output data buffer circuit adapted to receive a data bit and to transmit the data bit to the data bit line; and a smoothing circuit having a load circuit, the smoothing circuit having current draw characteristics that are complementary to a memory circuit in the dynamic random access memory, the memory circuit being coupled to a first voltage source through a first conductor having an inductance, the smoothing circuit being coupled to the first voltage source through the first conductor.

14. The computer system of claim 13 wherein the smoothing circuit comprises a circuit having complementary current draw characteristics to the output data buffer circuit.

15. The computer system of claim 14 wherein the output data buffer circuit comprises a pair of serially coupled NMOS transistors between the first voltage source and a second voltage source, the first transistor coupled to the first voltage source through the first conductor, the transistors coupled together at a first node, the first node coupled to the data bit line.

16. The computer system of claim 15 wherein the smoothing circuit comprises a third and fourth serially coupled NMOS transistors between the first voltage source and a second voltage source, the third transistor coupled to the first voltage source through the first conductor, the third and fourth transistors coupled together at a second node, the second node coupled to a dummy load, the dummy load having the same impedance.

17. The computer system of claim 13 wherein the smoothing circuit comprises a circuit that is a functionally identical copy of the primary circuit.

18. The computer system of claim 13 wherein the circuit is coupled to the first conductor at a first location, and the smoothing circuit is coupled to the first conductor at the first location.

19. The computer system of claim 13 wherein the circuit is coupled to the first conductor at a first location, and the smoothing circuit is coupled to the first conductor at a second location, the second location being relatively close to the first location.

20. The computer system of claim 13 wherein the circuit is coupled to a second voltage source through a second conductor having an inductance, the circuit coupled to the second conductor at a third location.

21. The computer system of claim 20 wherein the smoothing circuit is coupled to the second conductor at the third location.

22. The computer system of claim 20 wherein the smoothing circuit is coupled to the second conductor at the fourth location, the fourth location being relatively close to the third location.

23. The computer system of claim 13 wherein the first voltage source is Vcc.

24. The computer system of claim 20 wherein the second voltage source is ground.

* * * * *